US008420298B2

(12) United States Patent
Hirose et al.

(10) Patent No.: US 8,420,298 B2
(45) Date of Patent: Apr. 16, 2013

(54) METHOD FOR PRODUCTION OF CROSSLINKED POLYVINYL ACETAL RESIN, AND CROSSLINKED POLYVINYL ACETAL RESIN

(75) Inventors: Yuki Hirose, Shiga (JP); Hiroaki Takehara, Shiga (JP); Motokuni Ichitani, Shiga (JP); Takayuki Maeda, Shiga (JP)

(73) Assignee: Sekisui Chemical Co., Ltd., Osaka (JP)

( * ) Notice: Subject to any disclaimer, the term of this patent is extended or adjusted under 35 U.S.C. 154(b) by 661 days.

(21) Appl. No.: 12/450,673

(22) PCT Filed: Apr. 11, 2008

(86) PCT No.: PCT/JP2008/057186
§ 371 (c)(1),
(2), (4) Date: Dec. 17, 2009

(87) PCT Pub. No.: WO2008/126921
PCT Pub. Date: Oct. 23, 2008

(65) Prior Publication Data
US 2010/0112480 A1    May 6, 2010

(30) Foreign Application Priority Data

Apr. 11, 2007 (JP) ................. 2007-103775
May 23, 2007 (JP) ................. 2007-137214
May 23, 2007 (JP) ................. 2007-137215
May 23, 2007 (JP) ................. 2007-137216
Oct. 1, 2007 (JP) ................. 2007-258080
Oct. 1, 2007 (JP) ................. 2007-258082
Oct. 1, 2007 (JP) ................. 2007-258083

(51) Int. Cl.
*G03F 7/00* (2006.01)

(52) U.S. Cl.
USPC ...................... 430/306; 430/270.1

(58) Field of Classification Search .......... 430/302; 428/35
See application file for complete search history.

(56) References Cited

U.S. PATENT DOCUMENTS 4,741,985 A    5/1988  Aoai et al.
(Continued)

FOREIGN PATENT DOCUMENTS

EP    0 208 145    1/1987
(Continued)

OTHER PUBLICATIONS

English translation of the International Preliminary Report on Patentability.
(Continued)

*Primary Examiner* — Anca Eoff
*Assistant Examiner* — Chanceity Robinson
(74) *Attorney, Agent, or Firm* — Wenderoth, Lind & Ponack, L.L.P.

(57) ABSTRACT

An object of the present invention is to provide a method for producing a cross-linked polyvinyl acetal resin, which can provide a cross-linked polyvinyl acetal resin having high mechanical strength and excellent solvent resistance by a simple method without a cross-linking agent, and can solve such problems as sheet attack, insufficient strength, and instability of viscosity for a long-time storage, and another object of the present invention is to provide a cross-linked polyvinyl acetal resin produced by the above method for producing a cross-linked polyvinyl acetal resin. The method for producing a cross-linked polyvinyl acetal resin comprises the step of irradiating a polyvinyl acetal resin at least having structural units represented by the following formulas (1) to (4) with ultraviolet light having a wavelength in a range of 200 to 365 nm,

[Chem. 1]

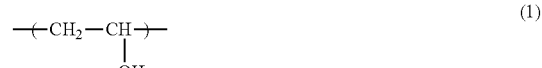

(1)

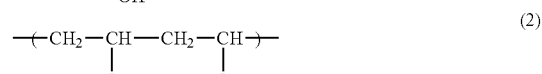

(2)

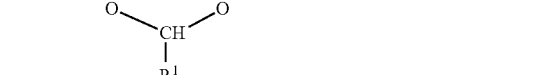

(3)

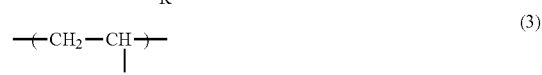

(4)

wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

[Chem. 2]

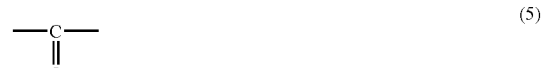

(5)

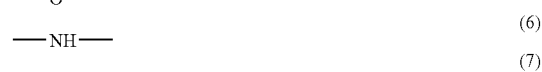

(6)

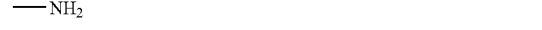

(7)

2 Claims, No Drawings

U.S. PATENT DOCUMENTS

| | | | |
|---|---|---|---|
| 4,965,313 A * | 10/1990 | Onda et al. | 525/59 |
| 5,134,033 A * | 7/1992 | Umise et al. | 428/32.6 |
| 5,637,435 A * | 6/1997 | Shimizu | 430/156 |
| 6,800,415 B2 * | 10/2004 | Lu et al. | 430/270.1 |
| 6,919,416 B2 * | 7/2005 | Pelosi et al. | 526/266 |
| 2004/0186217 A1 | 9/2004 | Pelosi et al. | |
| 2007/0293651 A1 * | 12/2007 | Tada et al. | 528/232 |

FOREIGN PATENT DOCUMENTS

| | | |
|---|---|---|
| EP | 0348755 A2 * | 6/1989 |
| EP | 0 348 755 | 1/1990 |
| JP | 61-281236 | 12/1986 |
| JP | 1-234483 | 9/1989 |
| JP | 2-77403 | 3/1990 |
| JP | 7-14973 | 2/1995 |
| JP | 10-292013 | 11/1998 |
| JP | 11-305030 | 11/1999 |
| JP | 2000-218952 | 8/2000 |
| JP | 2006-131445 | 5/2006 |
| JP | 2006-156493 | 6/2006 |
| JP | 2006-522863 | 10/2006 |
| JP | 2006-523754 | 10/2006 |
| TW | 200426184 | 10/2005 |
| WO | 2004/085535 | 10/2004 |
| WO | 2004/092262 | 10/2004 |

OTHER PUBLICATIONS

Supplementary European Search Report issued Feb. 28, 2011 in European Application No. 08740283.0.

* cited by examiner

METHOD FOR PRODUCTION OF CROSSLINKED POLYVINYL ACETAL RESIN, AND CROSSLINKED POLYVINYL ACETAL RESIN

This application is a U.S. national stage of International Application No. PCT/JP2008/057186 filed Apr. 11, 2008.

TECHNICAL FIELD

The present invention relates to a method for producing a cross-linked polyvinyl acetal resin, which can provide a cross-linked polyvinyl acetal resin having high mechanical strength and excellent solvent resistance by a simple method without a cross-linking agent, and thus can solve such problems as sheet attack, insufficient strength, and instability of viscosity for a long-time storage. The present invention also relates to a cross-linked polyvinyl acetal resin produced by the above method for producing a cross-linked polyvinyl acetal resin.

The present invention also relates to a method for producing a thermal transfer ink sheet, which can provide a cross-linked polyvinyl acetal resin having sufficient mechanical strength by a simple method without a cross-linking agent, and thus can solve such problems as insufficient strength and heat resistance of a thermal transfer ink sheet.

The present invention further relates to a method for producing an offset printing plate and a method for producing a negative resist, which can provide a cross-linked polyvinyl acetal resin having excellent photosensitivity and alkali-washability by a simple method without a cross-linking agent, and thus can solve such problems as unnecessary residues and undesired dissolution upon exposure-developing steps. The present invention also relates to a resin composition for a negative resist.

BACKGROUND ART

Polyvinyl acetal resins are excellent in strength, facilitate film formation, allow inorganic and organic particles such as pigments to be well dispersed therein, and are excellent in adhesiveness to a surface to be applied to, and thereby polyvinyl acetal resins have been used in various applications such as inks, paints, baking enamels, wash primers, and ceramic green sheets.

Studies have been performed in various fields for further increasing strength and solvent resistance of a polyvinyl acetal resin, and such studies have proposed, for example, a method in which a cross-linking agent is added to a polyvinyl acetal resin and then the mixture is heated to allow the polyvinyl acetal resin to be cross-linked between the molecules.

For example, Patent Document 1 discloses a method in which a polyvinyl acetal resin and an isocyanate resin are mixed with each other and the mixed resin is allowed to be cured. Patent Documents 2 and 3 disclose methods in which a cured film is formed by a thermosetting reaction. Patent Document 4 discloses a method in which hydrogen of a hydroxy group in polyvinyl butyral is substituted by N-methyleneacrylamide and then the polyvinyl butyral is irradiated with light such as electron beam to be cross-linked and cured.

The trouble is that, in these methods, it is required to add a component for triggering a cross-linking reaction, such as a cross-linking agent and a polymerization initiator, at the time of curing or to add it to a polyvinyl acetal resin in advance. Thus, it is difficult to stably store the resins in a state of a solution, and residues of the component for triggering a cross-linking reaction causes staining and degradation. Furthermore, processes get complicated.

In the methods of Patent Documents 2 and 3, a cross-linking reaction is allowed to proceed by thermosetting; however, in the case where a material to be coated with a resin is vulnerable to heat or heating cannot be performed in the process, the methods cannot be employed, or a cross-linking reaction insufficiently proceeds to cause sheet breaking. As disclosed in Examples of Patent Document 3, it requires much time to allow a cross-linking reaction to start without heating. Furthermore, a polyvinyl acetal resin is decomposed in the case of applying electron beam or X rays.

Accordingly, there is a demand for a method which is capable of producing a cross-linked polyvinyl acetal resin having a sufficient degree of cross-linkage and excellent solvent resistance without adding a photopolymerization initiator or a cross-linking agent such as an acryl monomer.

One of the applications of a polyvinyl acetal resin is a material for a thermal transfer ink sheet.

A thermal transfer technique has been conventionally employed as one of the means for forming and recording letters and images. In the thermal transfer technique, a thermal transfer image-receiving sheet is covered with an ink sheet in which a pigment or a dye is dispersed, and then heat is applied above the ink sheet. Thereby, the pigment or the dye is transferred onto the thermal transfer image-receiving sheet to form an image. The thermal transfer technique is broadly divided into a thermal wax transfer technique and a dye sublimation technique. The dye sublimation technique is employed for photo printing, output terminals for medical and analysis devices, photo printing for ID cards, and other purposes. The contemporary digitalizing world expects further improvement of the dye sublimation technique.

Examples of the dye sublimation-type thermal transfer ink sheet include a sheet in which ink layers, such as yellow, magenta, and cyan layers, and a protecting layer for imparting light fastness to a transferred image are successively formed.

Thermal transfer ink sheets for the dye sublimation-type thermal transfer technique have been recently required to be adaptable to high speed printing. In particular, ink layers of a thermal transfer ink sheet are required to be excellent in properties such as heat resistance, weather resistance, and ink retentivity; while a protecting layer is required to contain a highly-strong binder resin component and to have excellent abrasion resistance because it is to be laminated on the outermost surface after transferred onto an image-receiving paper.

In the case where ink layers or protecting layers of a thermal transfer ink sheet is formed by a conventional polyvinyl acetal resin, heat resistance or strength of the sheet is insufficient and thereby the sheet is not adaptable to high speed printing. Furthermore, use of a binder resin having a high glass transition temperature or a binder resin having a high degree of polymerization has been examined for the purpose of increasing the heat resistance and strength. However, these binders cause disadvantages, such as a longer dissolution time of a binder resin and increase in solution viscosity which is controlled upon application to a medium to inhibit easy solution transfer via a pump. Such disadvantages result in reduction in productivity.

Many studies have been conducted from various angles for strengthening a polyvinyl acetal resin used in the aforementioned fields. For example, the following method has been studied; that is, a cross-linking agent is added to a polyvinyl acetal resin and then a mixture is heated, and thereby the polyvinyl acetal resin is allowed to be cross-linked between their molecules.

Patent Documents 1 to 4 disclose methods for curing and cross-linking a polyvinyl acetal resin for dealing with the above problems. The trouble is that, in these methods, it is required to add a component for triggering a cross-linking reaction, such as a cross-linking agent and a polymerization initiator, at the time of curing or to add it to a polyvinyl acetal resin in advance. Thus, it is difficult to stably store the resins in a state of a solution, and residues of the component for triggering a cross-linking reaction causes staining and degradation. Furthermore, processes get complicated.

In the methods of Patent Documents 2 and 3, a cross-linking reaction is allowed to proceed by thermosetting; however, in the case where a material to be coated with a resin is vulnerable to heat or heating cannot be performed in the process, the methods cannot be employed, or a cross-linking reaction insufficiently proceeds to cause sheet breaking. As disclosed in Examples of Patent Document 3, it requires much time to allow a cross-linking reaction to start without heating. Furthermore, a polyvinyl acetal resin is decomposed in the case of applying electron beam or X rays.

Accordingly, there is a demand for a method which is capable of providing a cross-linked polyvinyl acetal resin having a sufficient degree of cross-linkage and high mechanical strength without adding a photopolymerization initiator or a cross-linking agent such as an acryl monomer.

A polyvinyl acetal resin is also used as a binder for an inorganic particle-dispersed paste in which inorganic particles such as electrically conductive powders and ceramic powders are dispersed. An inorganic particle-dispersed paste is formed into a predetermined shape by various printing methods such as screen printing and offset printing. In particular, offset printing can excellently print straight lines and plates for offset printing have high strength, so that production of address electrodes and bus electrodes of plasma displays by offset printing has been tested.

On an offset printing plate used in offset printing, a photosensitive material layer is irradiated with ultraviolet light to develop and form a pattern. Patterns have been finer recently, and accordingly, a resin layer which serves as a protruding portion is required to have high shape retentivity.

A polyvinyl acetal resin excellently adheres to a substrate and a film thereof has excellent strength; however, it cannot be used for pattering. Thus, a polyvinyl acetal resin is tentatively added to a conventional patterning material to achieve good patterning and retentivity. In such a case, although shape retentivity of a protruding portion increases, polyvinyl butyral is difficult to be dissolved in an alkali-washing liquid and thus washing is insufficiently performed, which results in unclear separation between protruding and recessed portions on an offset printing plate.

Studies have been performed from various angles for increasing strength and solvent resistance of a polyvinyl acetal resin. For example, the following method has been studied; that is, a cross-linking agent is added to a polyvinyl acetal resin and then the mixture is heated to allow the polyvinyl acetal resin to be cross-linked between the molecules.

For example, Patent Documents 1 to 4 disclose methods for curing and cross-linking a polyvinyl acetal resin for dealing with the above problems. Patent Documents 2 and 3 disclose curing methods by heat, so that it is not suitable for patterning. The method disclosed in Patent Document 4 requires addition of N-methylene acrylamido group by a post-reaction reaction after production of polyvinyl butyral. This results in problems such as high production cost and residues of a catalyst used in the post-reaction reaction to cause staining or difficulty in stable storage. Furthermore, a curing reaction requires a catalyst, and this results in difficulty in stable storage and discoloration and degradation due to catalyst residues.

Accordingly, there is a demand for a method for providing a polyvinyl acetal resin which excellently adheres to a substrate, forms a film having high strength, and is cross-linkable by application of ultraviolet light without a catalyst.

Patent Document 1: Japanese Kokai Publication No. 2006-156493 (JP-A 2006-156493)

Patent Document 2: Japanese Kohyo Publication No. 2006-522863 (JP-W 2006-522863)

Patent Document 3: Japanese Kohyo Publication No. 2006-523754 (JP-W 2006-523754)

Patent Document 4: Japanese Kokoku Publication No. H07-14973 (JP-B H07-14973)

DISCLOSURE OF THE INVENTION

Problems to be Solved by the Invention

In view of the above situation, an object of the present invention is to provide a method for producing a cross-linked polyvinyl acetal resin, which can provide a cross-linked polyvinyl acetal resin having high mechanical strength and excellent solvent resistance by a simple method without a cross-linking agent, and thus can solve such problems as sheet attack, insufficient strength, and instability of viscosity for a long time, and to provide a cross-linked polyvinyl acetal resin produced by the above method for producing a cross-linked polyvinyl acetal resin.

Another object of the present invention is to provide a method for producing a thermal transfer ink sheet, which can provide a cross-linked polyvinyl acetal resin having high mechanical strength by a simple method without a cross-linking agent, and thus can solve such problems as insufficient strength and heat resistance of a thermal transfer ink sheet.

Still another object of the present invention is to provide a method for producing an offset printing plate and a method for producing a negative resist, which can provide a cross-linked polyvinyl acetal resin having excellent photosensitivity and alkali-washability by a simple method without a cross-linking agent, and thus can solve such problems as unnecessary residues and undesired dissolution upon exposure-developing steps, and to provide a resin composition for a negative resist.

Means for Solving the Problems

One aspect of the present invention is a method for producing a cross-linked polyvinyl acetal resin, comprising the step of irradiating a polyvinyl acetal resin at least having structural units represented by the following formulas (1) to (4) with ultraviolet light having a wavelength in a range of 200 to 365 nm,

[Chem. 1]

(1)

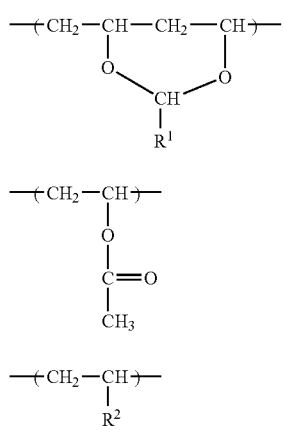

(2)

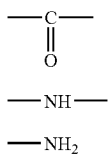

(3)

$-\!\!\!\!-\!\!(CH_2-CH)\!\!-\!\!\!\!-$
|
R²

(4)

wherein R¹ represents a hydrogen atom or a C1-C20 hydrocarbon group; and R² represents a group having two or more functional groups, the two or more functional groups each selected from the group consisting of the functional groups represented by the following formulas (5), (6), and (7).

[Chem. 2]

$$-\overset{\|}{\underset{O}{C}}-$$ (5)

$-\!\!-\!\!NH\!-\!\!-$ (6)

$-\!\!-\!\!NH_2$ (7)

The present invention will be specifically described hereinbelow.

The present inventors have made eager studies, and thus have found that a cross-linked polyvinyl acetal resin having a high degree of cross-linkage can be provided through a simple method without a cross-linking agent in the case of irradiating a polyvinyl acetal resin having predetermined structural units with ultraviolet light having a wavelength in the range of 200 to 365 nm to allow the polyvinyl acetal resin to be cross-linked. The present inventors have further found that such a cross-linked polyvinyl acetal resin has sufficient mechanical strength and excellent solvent resistance. Thus, the present invention has been completed.

The production method of a cross-linked polyvinyl acetal resin of the present invention comprises the step of irradiating a polyvinyl acetal resin at least having structural units represented by the following formulas (1) to (4) with ultraviolet light having a wavelength in the range of 200 to 365 nm.

A polyvinyl acetal resin at least having structural units represented by the following formulas (1) to (4) is used in the above step.

[Chem. 3]

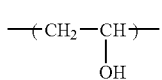

(1)

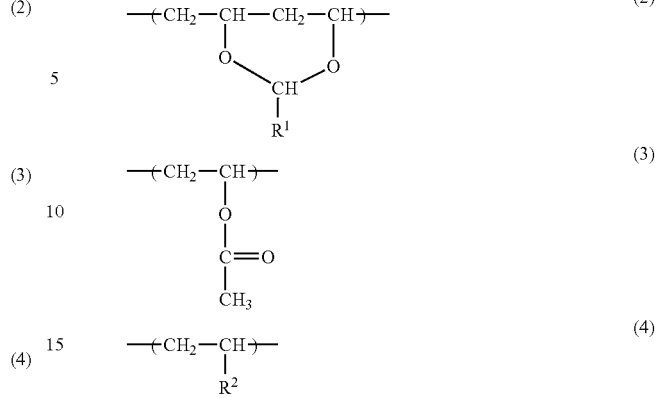

wherein R¹ represents a hydrogen atom or a C1-C20 hydrocarbon group; and R² represents a group having two or more functional groups, the two or more functional groups each selected from the group consisting of the functional groups represented by the following formulas (5), (6), and (7).

[Chem. 4]

 (5)

 (6)

 (7)

In the polyvinyl acetal resin, the amount of the vinyl alcohol unit represented by the formula (1) is desirably 17 mol % or more, and desirably 40 mol % or less. If the amount thereof is less than 17 mol %, solubility to an organic solvent to be used upon dissolution may be low. If the amount thereof is more than 40 mol %, the polyvinyl acetal resin easily absorbs moisture, and thereby the product may not be stably stored in the case of using the polyvinyl acetal resin as a binder resin.

In the polyvinyl acetal resin, the amount of the acetal unit represented by the formula (2) is desirably 35 mol % or more, and desirably 80 mol % or less. If the amount thereof is less than 35 mol %, the polyvinyl acetal resin may not be dissolved in an organic solvent to be used upon dissolution. If the amount thereof is more than 80 mol %, the amount of a residual hydroxy group may be small, and thereby strength of a cross-linked polyvinyl acetal resin to be provided may be poor.

In the polyvinyl acetal resin, an acetal group is formed by acetalization of two hydroxy groups. Thus, the number of a pair of the acetalized hydroxy groups is counted to obtain a degree of acetalization in terms of mol % in this description.

In the acetal unit represented by the formula (2), R¹ desirably consists of at least one of a hydrogen atom, a methyl group, and a butyl group. R¹ more desirably consists of a methyl group and a butyl group. Such a polyvinyl acetal resin gives the balance between intermolecular hydrogen bond force of the vinyl alcohol unit and steric hindrance of the acetal unit, and thereby a cross-linking reaction requires less energy. Thus, it is possible to provide a cross-linked polyvinyl acetal resin which is excellent in properties such as mechanical strength, solvent resistance, flexibility, and adhesiveness.

In the polyvinyl acetal resin, the amount of the acetyl unit represented by the formula (3) is desirably 0.1 mol % or more, and desirably 25 mol % or less. If the amount thereof deviates from the above range, solubility of a raw material polyvinyl alcohol may be low, which inhibits an acetalization reaction. The desirable upper limit of the amount thereof is 15 mol %.

In the polyvinyl acetal resin, the structural unit represented by the formula (4) has cross-linkability. When the polyvinyl acetal resin is irradiated with ultraviolet light having a wavelength in the range of 200 to 365 nm, the structural unit forms a cross-linking structure with another functional group in a molecule. Thus, a cross-linked polyvinyl acetal resin after curing has high mechanical strength as well as an appropriate elasticity.

In the structural unit represented by the formula (4), $R^2$ desirably has a moiety where first and second functional groups are allowed to bond to each other directly or a moiety where the first and second functional groups are allowed to bond via a third functional group which is different from the first and second functional groups. The first and second functional groups are selected from the group consisting of the functional groups represented by the following formulas (5), (6), and (7).

[Chem. 5]

(5)

(6)

(7)

In the structural unit represented by the formula (4), examples of $R^2$ include groups represented by the following formulas (8) and (9).

[Chem. 6]

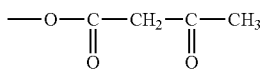
(8)

[Chem. 7]

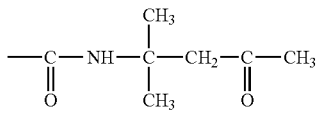
(9)

In the polyvinyl acetal resin, the amount of the structural unit represented by the formula (4) is desirably 0.01 mol % or more, and desirably 50 mol % or less. If the amount thereof is less than 0.01 mol %, formation of a cross-linking structure may not so sufficiently exert its effects that the mechanical strength may be low. If the amount thereof is more than 50 mol %, the degree of cross-linkage of a cross-linked body to be provided may be so high that flexibility thereof may be low.

The degree of polymerization of the polyvinyl acetal resin is desirably 200 or more, and desirably 4000 or less. In the case where the degree of polymerization is in the above range, a cross-linked body to be provided may be excellent in properties such as mechanical strength.

In the case of producing a polyvinyl acetal resin in which $R^2$ is the group represented by the formula (8), the polyvinyl acetal resin may be produced, for example, by acetalizing a modified polyvinyl alcohol having a β-dicarbonyl group, or by acetalizing an unmodified polyvinyl alcohol and then adding a β-dicarbonyl group thereto. Desirable among these is the method in which a modified polyvinyl alcohol having a β-dicarbonyl group is acetalized.

Any conventional method may be employed for adding a β-dicarbonyl group. Examples thereof include a method in which 4-methylene-2-oxetanone is added into a solution of dimethylsulfoxide (DMSO).

The acetalization method is not particularly limited, and conventionally-known methods may be employed. For example, the acetalization may be performed by adding an aldehyde to a solution, such as an aqueous solution of a modified polyvinyl alcohol, an alcohol solution, a water/alcohol mixed solution, or a dimethyl sulfoxide (DMSO) solution, in the presence of an acid catalyst.

The aldehyde to be used in the acetalization is not particularly limited. Examples thereof include formaldehyde, acetaldehyde, propionaldehyde, butylaldehyde, amylaldehyde, hexylaldehyde, heptylaldehyde, 2-ethylhexylaldehyde, cyclohexylaldehyde, furfural, glyoxal, glutaraldehyde, benzaldehyde, 2-methylbenzaldehyde, 3-methylbenzaldehyde, 4-methylbenzaldehyde, p-hydroxybenzaldehyde, m-hydroxybenzaldehyde, phenylacetaldehyde, and β-phenylpropionaldehyde. In particular, single use of acetaldehyde or butylaldehyde, or combination use of acetaldehyde and butylaldehyde is desirable.

The acid catalyst is not particularly limited, and both of organic acids and inorganic acids may be used. Examples thereof include acetic acid, paratoluene sulfonic acid, nitric acid, sulfuric acid, and hydrochloric acid.

The acetalization reaction is desirably terminated by neutralization with alkali. The alkali is not particularly limited, and examples thereof include sodium hydroxide, potassium hydroxide, ammonium, sodium acetate, sodium carbonate, sodium hydrogencarbonate, potassium carbonate, and potassium hydrogencarbonate.

Before and after the neutralization, the modified polyvinyl acetal resin obtained is desirably washed with a substance such as water. In order to prevent contamination by impurities contained in washing water, pure water is desirably used for washing.

In the present invention, the polyvinyl acetal resin is allowed to be cross-linked by applying ultraviolet light having a wavelength in the range of 200 to 365 nm thereto.

The polyvinyl acetal resin is allowed to be cross-linked not by heating but by light application in the present invention, and thereby it is possible to provide a cross-linked polyvinyl acetal resin by a simple method. Furthermore, the cross-linking reaction does not require a cross-linking agent, and thereby it is possible to provide a cross-linked polyvinyl acetal resin having excellently stable viscosity.

In the case of the aforementioned polyvinyl acetal resin, it is possible to provide a cross-linked polyvinyl acetal resin having a high degree of cross-linkage without applying electron beam or X-rays. Thus, decomposition of a polyvinyl acetal resin upon application of electron beam or X-rays can be prevented and the polyvinyl acetal resin may be cross-linked and cured by a simple device.

In the case of applying light having a wavelength shorter than 200 nm, a resin may be decomposed. In the case of applying ultraviolet light having a wavelength longer than 365 nm, a cross-linking reaction may not be allowed to proceed sufficiently. Light desirably has a wavelength in the range of 215 to 280 nm. The ultraviolet light having a wavelength in the range of 200 to 365 nm may be a light with a continuous spectrum or a light with a line spectrum. In the case where the ultraviolet light is a light with a continuous spectrum, the ultraviolet light may at least contain an ultraviolet light having a wavelength in the range of 200 to 365 nm.

A light source of the ultraviolet light having a wavelength in the range of 200 to 365 nm is not particularly limited as long as it can emit ultraviolet light having a wavelength in the above range. Examples thereof include ultra-high pressure mercury vapor lamps, high pressure mercury vapor lamps, low pressure mercury vapor lamps, metal halide lamps, excimer lamps, cold cathodes, UV-LED lamps, halogen lamps, and high frequency induction UV lamps.

The method for producing a cross-linked polyvinyl acetal resin of the present invention may be utilized for various applications such as inks, paints, baking enamels, wash primers, paints for dye sublimation, dispersants, adhesives, ceramic green sheets, electrode pastes, multilayer ceramic capacitors, thermo-developing photosensitive materials, photoresists, seal agents, dry film resists for production of plasma display panels, dielectric layers, piezoelectric films, offset printing pastes, electrolyte films for solid oxide fuel cells, interlayer films for laminated glasses, build-up substrates, resin filters, green compacts, ribs of plasma display panels, hollow fine particles, reflection films, polarizing films, and phase contrast films.

For example, in the case of producing an interlayer film for a laminated glass by the method of the present invention, the cross-linking structure makes it possible to maintain viscosity of an interlayer film at high temperatures, and thereby displacement of a glass can be prevented upon glass lamination.

In the case of producing a build-up substrate by the method of the present invention, the cross-linking structure prevents easy moisture absorption and deformation. Thus, a build-up substrate to be obtained absorbs less moisture and maintains its shape stably, so that defects such as warpage of the substrate can be prevented.

In the case of producing a resin filter by the method of the present invention, that is, ultraviolet light defined in the present invention is applied to a molded body containing a specific polyvinyl acetal resin, a polyvinyl acetal resin has a high degree of cross-linkage. This results in great increase in durability of a resin filter to be obtained.

In the case of producing a green compact by the method of the present invention, the cross-linking structure gives great increase in mechanical strength of the green compact, and thereby defects such as breaks and cracks can be prevented.

In the case of producing a rib in a plasma display panel by the method of the present invention, a rib precursor has increased strength and thereby the rib precursor can be subjected to sandblast-forming. In particular, the method of the present invention can be suitably used in a production method comprising a batch firing step. Also in the production of a rib in a plasma display panel, UV curability is imparted to a rib paste, so that rib can be formed by development even without sandblasting.

Furthermore, in the case of producing an offset printing paste by the method of the present invention, patterning and development are performed without a cross-linking agent, so that degradation and discoloration are prevented. Thus, an offset printing paste having excellent shape retentivity can be provided.

In the case of producing hollow fine particles by the method of the present invention, the cross-linking structure increases strength of the particles, so that the particles can retain their shape. Thus, the particles can have smaller particle size.

In the case of producing a reflection sheet by the method of the present invention, the cross-linking structure greatly increases adhesiveness between a sheet made of a polyvinyl acetal resin and an evaporated aluminum layer. Thus, defects such as separation thereof can be prevented.

In the case of producing a polarizing film by the method of the present invention, the cross-linking structure prevents easy moisture absorption. Thus, defects such as film warpage can be prevented even without formation of an overcoat layer.

In the case of producing a phase contrast film by the method of the present invention, the cross-linking structure increases heat resistance. Thus, the film can endure a durability test.

The method for producing a cross-linked polyvinyl acetal resin of the present invention can provide a cross-linked polyvinyl acetal resin. Such a cross-linked polyvinyl acetal resin is also one aspect of the present invention.

The cross-linked polyvinyl acetal resin of the present invention produced by the above production method can have sufficient mechanical strength and excellent solvent resistance. Thus, troubles such as sheet attack and damages on a green sheet can be prevented.

The cross-linking reaction does not require a component for triggering a cross-linking reaction such as a cross-linking agent and photopolymerization initiator. Thus, the cross-linked polyvinyl acetal resin of the present invention can be stably stored in the case where the resin is dissolved in a solvent.

Furthermore, the resin does not suffer from troubles such as discoloration and degradation due to residues of a cross-linking agent.

As is the case with the conventional polyvinyl acetal resins, the cross-linked polyvinyl acetal resin of the present invention is high in strength, facilitates film formation, and allows inorganic and organic particles such as pigments to be well dispersed therein. Furthermore, the cross-linked polyvinyl acetal resin of the present invention can have excellent mechanical strength and solvent resistance which the conventional polyvinyl acetal resins do not have. Because of such advantages, the cross-linked polyvinyl acetal resin of the present invention may be utilized for various applications such as inks, paints, baking enamels, wash primers, paints for dye sublimation, dispersants, adhesives, ceramic green sheets, electrode pastes, multilayer ceramic capacitors, thermo-developing photosensitive materials, photoresists, seal agents, dry film resists for production of plasma display panels, dielectric layers, piezoelectric films, offset printing pastes, electrolyte films for solid oxide fuel cells, interlayer films for laminated glasses, build-up substrates, resin filters, green compacts, ribs of plasma display panels, hollow fine particles, reflection films, polarizing films, and phase contrast films.

In the method for producing a thermal transfer ink sheet of the present invention, an ink layer and/or a protecting layer is formed on at least one surface of a support medium. The production method comprises the steps of: applying a resin composition containing a polyvinyl acetal resin at least having structural units represented by the following formulas (1) to (4) and an organic solvent to the support medium; drying the resin composition; and irradiating the resin composition with ultraviolet light having a wavelength in the range of 200 to 365 nm to allow a cross-linking reaction to proceed,

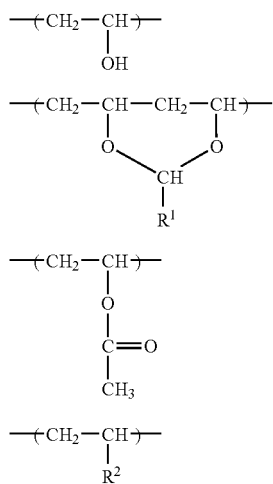

(1) $-\text{(CH}_2-\text{CH)}-$ | OH (2) $-\text{(CH}_2-\text{CH}-\text{CH}_2-\text{CH)}-$ with O-CH(R$^1$)-O bridge (3) $-\text{(CH}_2-\text{CH)}-$ | O-C(=O)-CH$_3$ (4) $-\text{(CH}_2-\text{CH)}-$ | R$^2$ wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

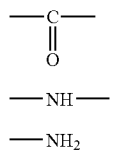

(5) $-\text{C}(=\text{O})-$ (6) $-\text{NH}-$ (7) $-\text{NH}_2$

The present inventors have made eager studies, and thus have found that a cross-linked polyvinyl acetal resin having a high degree of cross-linkage can be provided by a simple method without a cross-linking agent in the case of applying a resin composition which contains a polyvinyl acetal resin having predetermined structural units, drying the resin composition, and irradiating the resin composition with ultraviolet light having a wavelength in the range of 200 to 365 nm to allow the polyvinyl acetal resin to be cross-linked. The present inventors have further found that the aforementioned cross-linked polyvinyl acetal resin has sufficient strength and it is capable of increasing strength and preventing reduction in heat resistance of the provided thermal transfer ink sheet at an ink layer and/or a protecting layer. Thus, the present invention has been completed.

The cross-linked polyvinyl acetal resin provided by the production method of the present invention can have greatly increased heat resistance and mechanical strength, and can be adaptable to high speed printing.

In the present invention, an ink layer and/or a protecting layer is formed as follows: preparing a resin composition containing a polyvinyl acetal resin having at least structural units represented by the following formulas (1) to (4) and an organic solvent; applying the resin composition to a supporting medium; drying the resin composition to provide an ink layer precursor and/or a protecting layer precursor; and irradiating the ink layer precursor and/or the protecting layer precursor with ultraviolet light having a wavelength in the range of 200 to 365 nm to allow a cross-linking reaction to proceed.

The polyvinyl acetal resin at least has structural units represented by the following formulas (1) to (4):

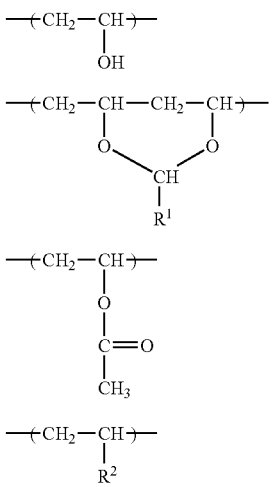

(1) $-\text{(CH}_2-\text{CH)}-$ | OH (2) $-\text{(CH}_2-\text{CH}-\text{CH}_2-\text{CH)}-$ with O-CH(R$^1$)-O bridge (3) $-\text{(CH}_2-\text{CH)}-$ | O-C(=O)-CH$_3$ (4) $-\text{(CH}_2-\text{CH)}-$ | R$^2$ wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

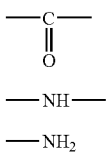

(5) $-\text{C}(=\text{O})-$ (6) $-\text{NH}-$ (7) $-\text{NH}_2$

In the polyvinyl acetal resin, the amount of the vinyl alcohol unit represented by the formula (1) is desirably 17 mol % or more, and desirably 40 mol % or less. If the amount thereof is less than 17 mol %, solubility to an organic solvent to be used upon dissolution may be low. If the amount thereof is more than 40 mol %, the polyvinyl acetal resin easily absorbs moisture, and thereby the product may not be stably stored in the case of using the polyvinyl acetal resin as a binder resin.

In the polyvinyl acetal resin, the amount of the acetal unit represented by the formula (2) is desirably 35 mol % or more, and desirably 80 mol % or less. If the amount thereof is less than 35 mol %, the polyvinyl acetal resin may not be dissolved in an organic solvent to be used upon dissolution. If the amount thereof is more than 80 mol %, the amount of a residual hydroxy group may be small, and thereby strength of a cross-linked polyvinyl acetal resin to be provided may be poor.

In the polyvinyl acetal resin, an acetal group is formed by acetalization of two hydroxy groups. Thus, the number of a pair of the acetalized hydroxy groups is counted to obtain a degree of acetalization in terms of mol % in this description.

In the acetal unit represented by the formula (2), $R^1$ desirably consists of a hydrogen atom, a methyl group, and a butyl group. Such a polyvinyl acetal resin can provide a cross-linked polyvinyl acetal resin which is excellent in properties such as mechanical strength and solvent resistance.

In the polyvinyl acetal resin, the amount of the acetyl unit represented by the formula (3) is desirably 0.1 mol % or more, and desirably 25 mol % or less. If the amount thereof deviates from the above range, solubility of a raw material polyvinyl alcohol may be low, which inhibits an acetalization reaction. The desirable upper limit of the amount thereof is 15 mol %.

In the polyvinyl acetal resin, the structural unit represented by the formula (4) has cross-linkability. When the polyvinyl acetal resin is irradiated with ultraviolet light having a wavelength in the range of 200 to 365 nm, the structural unit forms a cross-linking structure with other functional groups in a molecule. Thus, a cross-linked polyvinyl acetal resin after curing has high mechanical strength as well as a reasonable elasticity.

In the structural unit represented by the formula (4), $R^2$ desirably has a moiety where first and second functional groups are allowed to bond to each other directly or a moiety where the first and second functional groups are allowed to bond via a third functional group which is different from the first and second functional groups. The first and second functional groups are selected from the group consisting of the functional groups represented by the following formulas (5), (6), and (7).

[Chem. 12]

(5)

(6)

(7)

In the structural unit represented by the formula (4), examples of $R^2$ include groups represented by the following formulas (8) and (9).

[Chem. 13]

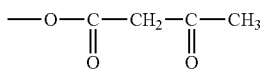

(8)

[Chem. 14]

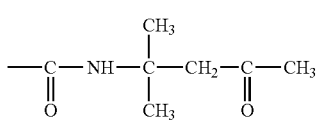

(9)

In the polyvinyl acetal resin, the amount of the structural unit represented by the formula (4) is desirably 0.01 mol % or more, and desirably 50 mol % or less. If the amount thereof is less than 0.01 mol %, formation of a cross-linking structure may not so sufficiently exert its effects that the mechanical strength may be low. If the amount thereof is more than 50 mol %, the degree of cross-linkage of a cross-linked body to be provided may be so high that flexibility thereof may be low.

The degree of polymerization of the polyvinyl acetal resin is desirably 200 or more, and desirably 4000 or less. In the case where the degree of polymerization is in the above range, a cross-linked body to be provided may be excellent in properties such as mechanical strength.

In the case of producing a polyvinyl acetal resin in which $R^2$ is the group represented by the formula (8), the polyvinyl acetal resin may be produced, for example, by acetalizing a modified polyvinyl alcohol having a β-dicarbonyl group, or by acetalizing an unmodified polyvinyl alcohol and then adding a β-dicarbonyl group thereto. Desirable among these is the method in which a modified polyvinyl alcohol having a β-dicarbonyl group is acetalized.

The acetalization method is not particularly limited, and conventionally-known methods may be employed. For example, the acetalization may be performed by adding an aldehyde to a solution, such as an aqueous solution of a modified polyvinyl alcohol, an alcohol solution, a water/alcohol mixed solution, or a dimethyl sulfoxide (DMSO) solution, in the presence of an acid catalyst.

The aldehyde to be used in the acetalization is not particularly limited. Examples thereof include formaldehyde, acetaldehyde, propionaldehyde, butylaldehyde, amylaldehyde, hexylaldehyde, heptylaldehyde, 2-ethylhexylaldehyde, cyclohexylaldehyde, furfural, glyoxal, glutaraldehyde, benzaldehyde, 2-methylbenzaldehyde, 3-methylbenzaldehyde, 4-methylbenzaldehyde, p-hydroxybenzaldehyde, m-hydroxybenzaldehyde, phenylacetaldehyde, and β-phenylpropionaldehyde. In particular, single use of acetaldehyde or butylaldehyde, or combination use of acetaldehyde and butylaldehyde is desirable.

The acid catalyst is not particularly limited, and both of organic acids and inorganic acids may be used. Examples thereof include acetic acid, paratoluene sulfonic acid, nitric acid, sulfuric acid, and hydrochloric acid.

The acetalization reaction is desirably terminated by neutralization with alkali. The alkali is not particularly limited, and examples thereof include sodium hydroxide, potassium hydroxide, ammonium, sodium acetate, sodium carbonate, sodium hydrogencarbonate, potassium carbonate, and potassium hydrogencarbonate.

Before and after the neutralization, the modified polyvinyl acetal resin obtained is desirably washed with a substance such as water. In order to prevent contamination by impurities contained in washing water, pure water is desirably used for washing.

The resin composition used in the method for producing a thermal transfer ink sheet of the present invention may be used in formation of the ink layer and of the protecting layer.

In the case of forming the ink layer by the resin composition, dyes such as a yellow dye, a magenta dye, and a cyan dye are added thereto. Conventionally-known dyes may be used as the dyes to be added.

In the present invention, the polyvinyl acetal resin is allowed to be cross-linked by applying the resin composition to a supporting medium; drying the resin composition to provide an ink layer precursor and/or a protecting layer precursor; and irradiating the ink layer precursor and/or the protecting layer precursor with ultraviolet light having a wavelength in the range of 200 to 365 nm.

The polyvinyl acetal resin is allowed to be cross-linked not by heating but by light application in the present invention, and thereby it is possible to provide a cross-linked polyvinyl acetal resin having sufficient mechanical strength and excellent solvent resistance by a simple method.

In the case of the aforementioned polyvinyl acetal resin, it is possible to provide a cross-linked polyvinyl acetal resin having a high degree of cross-linkage without applying electron beam or X-rays. Thus, decomposition of a polyvinyl acetal resin upon application of electron beam or X-rays can be prevented and the polyvinyl acetal resin may be cross-linked and cured by a simple device.

In the case of applying light having a wavelength shorter than 200 nm, a resin may be decomposed. In the case of applying ultraviolet light having a wavelength longer than 365 nm, a cross-linking reaction may not be allowed to proceed sufficiently. Light desirably has a wavelength in the range of 215 to 280 nm. The ultraviolet light having a wavelength in the range of 200 to 365 nm may be a light with a continuous spectrum or a light with a line spectrum. In the case where the ultraviolet light is a light with a continuous spectrum, the ultraviolet light may at least contain an ultraviolet light having a wavelength in the range of 200 to 365 nm.

A light source of the ultraviolet light having a wavelength in the range of 200 to 365 nm is not particularly limited as long as it can emit ultraviolet light having a wavelength in the above range. Examples thereof include ultra-high pressure mercury vapor lamps, high pressure mercury vapor lamps, low pressure mercury vapor lamps, metal halide lamps, excimer lamps, cold cathodes, UV-LED lamps, halogen lamps, and high frequency induction UV lamps.

The support medium and the organic solvent used in the method for producing a thermal transfer ink sheet of the present invention are not particularly limited, and conventionally-known ones used as materials for a thermal transfer ink sheet may be used.

Also, in the method for producing a thermal transfer ink sheet of the present invention, the resin composition may be applied to the support medium and dried by any methods, and conventionally-known ones may be employed.

In the case of forming an ink layer and a protecting layer and irradiating the ink layer with ultraviolet light in the method for producing a thermal transfer ink sheet of the present invention, the protecting layer may be allowed to be cross-linked by preliminary application of ultraviolet light to be strengthened, or may be allowed to be cross-linked by application of ultraviolet light after thermal transfer to an image receiving sheet or at the same time of the thermal transfer.

The method for producing an offset printing plate of the present invention comprises the steps of: preparing a resin composition for an offset printing plate containing a polyvinyl acetal resin at least having structural units represented by the following formulas (1) to (4) and an organic solvent; and irradiating the resin composition for an offset printing plate with ultraviolet light having a wavelength in the range of 200 to 365 nm to allow a cross-linking reaction to proceed,

[Chem. 15]

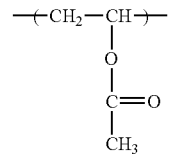  (1)

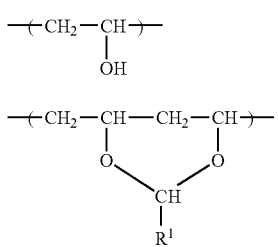  (2)

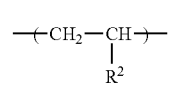  (3)

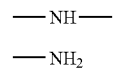  (4)

wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

[Chem. 16]

  (5)

—NH—  (6)

—NH$_2$  (7)

The method for producing a negative resist of the present invention comprises the steps of: preparing a resin composition for a negative resist containing a polyvinyl acetal resin at least having structural units represented by the following formulas (1) to (4) and an organic solvent; and irradiating the resin composition for a negative resist with ultraviolet light having a wavelength in the range of 200 to 365 nm to allow a cross-linking reaction to proceed,

[Chem. 17]

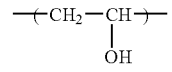  (1)

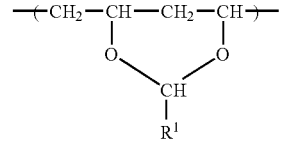  (2)

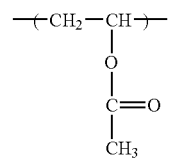  (3)

—(CH$_2$—CH)—
        |
        R$^2$  (4)

wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

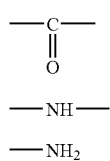

(5)

(6)

(7)

The resin composition for a negative resist of the present invention contains a polyvinyl acetal resin at least having structural units represented by the following formulas (1) to (4) and an organic solvent.

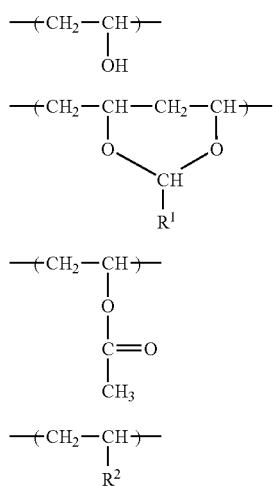

(1)

(2)

(3)

(4)

wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

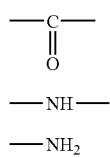

(5)

(6)

(7)

The present invention will be specifically described hereinbelow.

The method for producing an offset printing plate of the present invention comprises the steps of: preparing a resin composition for an offset printing plate containing a polyvinyl acetal resin at least having structural units represented by the following formulas (1) to (4) and an organic solvent; and irradiating the resin composition for an offset printing plate with ultraviolet light having a wavelength in the range of 200 to 365 nm to allow a cross-linking reaction to proceed.

The present inventors have made eager studies, and thus have found that a cross-linked polyvinyl acetal resin having excellent solvent resistance and strength can be provided in the case of irradiating a resin composition for an offset printing plate containing a polyvinyl acetal resin having predetermined structural units with ultraviolet light having a wavelength in the range of 200 to 365 nm to allow the polyvinyl acetal resin to be cross-linked. Thus, the offset printing plate which can excellently retain its shape without a cross-linking agent has been completed.

The production method of an offset printing plate of the present invention comprises the step of preparing a resin composition for an offset printing plate containing a polyvinyl acetal resin at least having structural units represented by the following formulas (1) to (4) and an organic solvent.

In the above step, a polyvinyl acetal resin at least having structural units represented by the following formulas (1) to (4) is used.

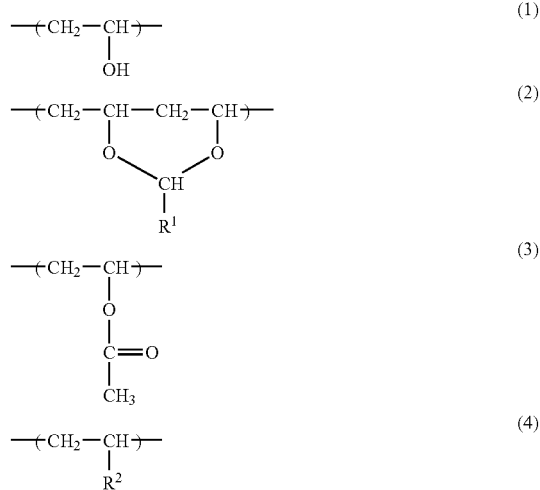

(1)

(2)

(3)

(4)

wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

(5)

(6)

(7)

In the polyvinyl acetal resin, the amount of the vinyl alcohol unit represented by the formula (1) is desirably 17 mol % or more, and desirably 40 mol % or less. If the amount thereof is less than 17 mol %, solubility to an organic solvent to be used upon dissolution may be low and adhesiveness to a substrate may be poor. If the amount thereof is more than 40 mol %, the polyvinyl acetal resin easily absorbs moisture, and thereby the product may not be stably stored in the case of using the polyvinyl acetal resin as a binder resin.

In the polyvinyl acetal resin, the amount of the acetal unit represented by the formula (2) is desirably 35 mol % or more, and desirably 80 mol % or less. If the amount thereof is less than 35 mol %, the polyvinyl acetal resin may not be dissolved in an organic solvent to be used upon dissolution. If the amount thereof is more than 80 mol %, the amount of a residual hydroxy group may be small, and thereby strength of a cross-linked polyvinyl acetal resin to be provided may be poor and adhesiveness to a substrate may be poor.

In the polyvinyl acetal resin, an acetal group is formed by acetalization of two hydroxy groups. Thus, the number of a pair of the acetalized hydroxy groups is counted to obtain a degree of acetalization in terms of mol % in this description.

In the acetal unit represented by the formula (2), $R^1$ desirably consists of at least one of a hydrogen atom, a methyl group, and a butyl group. In particular, $R^1$ more desirably consists of a methyl group and a butyl group. More desirably, a molar ratio of (methyl group):(butyl group) in $R^1$ is in the range of 10:0 to 6:4. Such a polyvinyl acetal resin gives the excellent balance between intermolecular hydrogen bond force of the vinyl alcohol unit and steric hindrance of the acetal unit, and thereby a cross-linking reaction requires less energy. Thus, it is possible to provide a cross-linked polyvinyl acetal resin which is excellent in properties such as mechanical strength, solvent resistance, flexibility, and adhesiveness.

In the polyvinyl acetal resin, the amount of the acetyl unit represented by the formula (3) is desirably 0.1 mol % or more, and desirably 25 mol % or less. If the amount thereof deviates from the above range, solubility of a raw material polyvinyl alcohol may be low, which inhibits an acetalization reaction. The desirable upper limit of the amount thereof is 15 mol %.

In the polyvinyl acetal resin, the structural unit represented by the formula (4) has cross-linkability. When the polyvinyl acetal resin is irradiated with ultraviolet light having a wavelength in the range of 200 to 365 nm, the structural unit forms a cross-linking structure with another functional group in a molecule. Therefore, a cured cross-linked polyvinyl acetal resin has high solvent resistance, and thereby solubility differs between a light applied portion and a light unexposed portion. The difference in solubility makes target-pattern formation possible.

A highly cross-linked portion has high mechanical strength and excellent adhesiveness to a substrate, and thereby a protruding portion after development has high retentivity.

In the structural unit represented by the formula (4), $R^2$ desirably has a moiety where first and second functional groups are allowed to bond to each other directly or a moiety where the first and second functional groups are allowed to bond via a third functional group which is different from the first and second functional groups. The first and second functional groups are selected from the group consisting of the functional groups represented by the following formulas (5), (6), and (7).

[Chem. 23]

$$-\underset{\underset{O}{\|}}{C}- \quad (5)$$

$$-NH- \quad (6)$$

$$-NH_2 \quad (7)$$

In the structural unit represented by the formula (4), examples of $R^2$ include groups represented by the following formulas (8) and (9).

[Chem. 24]

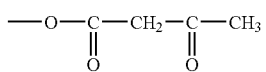

(8)

[Chem. 25]

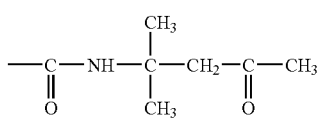

(9)

In the polyvinyl acetal resin, the amount of the structural unit represented by the formula (4) is desirably 0.01 mol % or more, and desirably 50 mol % or less. If the amount thereof is less than 0.01 mol %, formation of a cross-linking structure may not so sufficiently exert its effects that a pattern may be insufficiently formed. If the amount thereof is more than 50 mol %, the degree of cross-linkage of a cross-linked body to be provided may be so high that adhesiveness to a substrate may be low.

The degree of polymerization of the polyvinyl acetal resin is desirably 200 or more, and desirably 4000 or less. In the case where the degree of polymerization is in the above range, a cross-linked body to be provided may be excellent in properties such as mechanical strength.

In the case of producing a polyvinyl acetal resin in which $R^2$ is the group represented by the formula (8), the polyvinyl acetal resin may be produced, for example, by acetalizing a modified polyvinyl alcohol having a β-dicarbonyl group, or by acetalizing an unmodified polyvinyl alcohol and then adding a β-dicarbonyl group thereto.

Any conventional method may be employed for adding a β-dicarbonyl group. Examples thereof include a method in which 4-methylene-2-oxetanone is added into a solution of dimethylsulfoxide (DMSO).

The acetalization method is not particularly limited, and conventionally-known methods may be employed. For example, the acetalization may be performed by adding an aldehyde to a solution, such as an aqueous solution of a modified polyvinyl alcohol, an alcohol solution, a water/alcohol mixed solution, or a dimethyl sulfoxide (DMSO) solution, in the presence of an acid catalyst.

The aldehyde to be used in the acetalization is not particularly limited. Examples thereof include formaldehyde, acetaldehyde, propionaldehyde, butylaldehyde, amylaldehyde, hexylaldehyde, heptylaldehyde, 2-ethylhexylaldehyde, cyclohexylaldehyde, furfural, glyoxal, glutaraldehyde, benzaldehyde, 2-methylbenzaldehyde, 3-methylbenzaldehyde, 4-methylbenzaldehyde, p-hydroxybenzaldehyde, m-hydroxybenzaldehyde, phenylacetaldehyde, and β-phenylpropionaldehyde. In particular, single use of acetaldehyde or butylaldehyde, or combination use of acetaldehyde and butylaldehyde is desirable.

The acid catalyst is not particularly limited, and both of organic acids and inorganic acids may be used. Examples thereof include acetic acid, paratoluene sulfonic acid, nitric acid, sulfuric acid, and hydrochloric acid.

The acetalization reaction is desirably terminated by neutralization with alkali. The alkali is not particularly limited, and examples thereof include sodium hydroxide, potassium hydroxide, ammonium, sodium acetate, sodium carbonate, sodium hydrogencarbonate, potassium carbonate, and potassium hydrogencarbonate.

Before and after the neutralization, the modified polyvinyl acetal resin obtained is desirably washed with a substance such as water. In order to prevent contamination by impurities contained in washing water, pure water is desirably used for washing.

In the present invention, the polyvinyl acetal resin is allowed to be cross-linked by irradiating the resin composition for an offset printing plate with ultraviolet light having a wavelength in the range of 200 to 365 nm.

In the case of applying light having a wavelength shorter than 200 nm, a resin may be decomposed. In the case of applying ultraviolet light having a wavelength longer than 365 nm, a cross-linking reaction may not be allowed to proceed sufficiently. Light desirably has a wavelength in the range of 215 to 280 nm. The ultraviolet light having a wavelength in the range of 200 to 365 nm may be a light with a continuous spectrum or a light with a line spectrum. In the case where the ultraviolet light is a light with a continuous spectrum, the ultraviolet light may at least contain an ultraviolet light having a wavelength in the range of 200 to 365 nm.

A light source of the ultraviolet light having a wavelength in the range of 200 to 365 nm is not particularly limited as long as it can emit ultraviolet light having a wavelength in the above range. Examples thereof include ultra-high pressure mercury vapor lamps, high pressure mercury vapor lamps, low pressure mercury vapor lamps, metal halide lamps, excimer lamps, cold cathodes, UV-LED lamps, halogen lamps, and high frequency induction UV lamps.

The method for producing a negative resist of the present invention comprises the steps of: preparing a resin composition for a negative resist containing a polyvinyl acetal resin at least having structural units represented by the following formulas (1) to (4); and irradiating the resin composition for a negative resist with ultraviolet light having a wavelength in the range of 200 to 365 nm,

[Chem. 26]

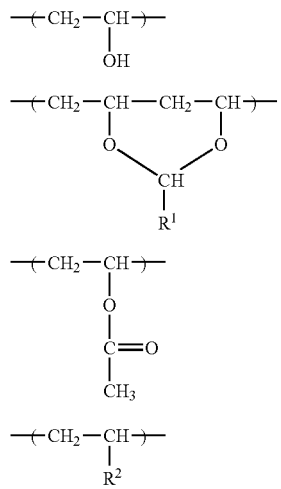

wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

[Chem. 27]

 (5)

 (6)

 (7)

The present inventors have made eager studies, and thus have found that a cross-linked polyvinyl acetal resin having excellent solvent resistance and strength can be provided in the case of irradiating a resin composition for a negative resist containing a polyvinyl acetal resin having predetermined structural units with ultraviolet light having a wavelength in the range of 200 to 365 nm to allow the polyvinyl acetal resin to be cross-linked. Thus, the present invention has been completed.

The organic solvent used in the method for producing a negative resist of the present invention is not particularly limited, and conventionally-known ones may be used. A conventionally-known material such as a photopolymerizable monomer and a photopolymerization initiator may be used together to the extent that the effects of the invention are not suppressed.

The polyvinyl acetal resin at least having structural units represented by the following formulas (1) to (4) and the step of applying ultraviolet light having a wavelength in the range of 200 to 365 nm are the same as those in the production method of an offset printing plate of the present invention. Thus, they are not specifically described herein.

When ultraviolet light having a wavelength in the range of 200 to 365 nm is applied to the resin composition for a negative resist containing a polyvinyl acetal resin at least having structural units represented by the following formulas (1) to (4) and an organic solvent to be used in the method for producing a negative resist of the present invention, the resin composition for a negative resist is allowed to be cross-linked to provide a negative resist having sufficient solvent resistance and strength.

Such a resin composition for a negative resist is also one aspect of the present invention.

[Chem. 28]

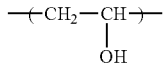 (1)

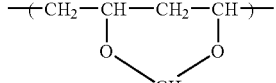 (2)

 (3)

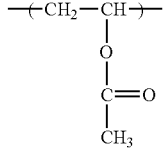

-continued

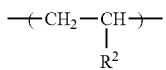
(4)

Wherein $R^1$ represents a hydrogen atom or a C1-C20 hydrocarbon group; and $R^2$ represents a group having two or more functional groups, the two or more functional groups each selected from the group consisting of the functional groups represented by the following formulas (5), (6), and (7).

[Chem. 29]

(5)

(6)

(7)

Effects of the Invention

According to the present invention, it is possible to provide a method for producing a cross-linked polyvinyl acetal resin, which can provide a cross-linked polyvinyl acetal resin having high mechanical strength and excellent solvent resistance by a simple method without a cross-linking agent, and thus can solve such problems as sheet attack, insufficient strength, and instability of viscosity for a long time. It is also possible to provide a cross-linked polyvinyl acetal resin produced by the above method for producing a cross-linked polyvinyl acetal resin.

It is also possible to provide a thermal transfer ink sheet which can provide a cross-linked polyvinyl acetal resin having high mechanical strength by a simple method without a cross-linking agent, and thus can solve such problems as insufficient strength and heat resistance of an obtained thermal transfer ink sheet.

It is further possible to provide a method for producing an offset printing plate and a method for producing a negative resist, which can provide a cross-linked polyvinyl acetal resin having excellent photosensitivity and alkali-washability by a simple method without a cross-linking agent, and thus can solve such problems as unnecessary residues and undesired dissolution upon exposure-developing steps. It is also possible to provide a resin composition for a negative resist.

BEST MODE FOR CARRYING OUT THE INVENTION

The present invention will be more specifically described hereinbelow with reference to the examples, and the present invention is not limited to these examples.

Example 1

Preparation of Modified Polyvinyl Acetal Resin

A modified polyvinyl alcohol (100 parts by weight, degree of saponification: 98.8%, amount of the structural unit having $R^2$ represented by the formula (8): 2 mol %) was dissolved in 1200 parts by weight of distilled water under heating, and then the solution was maintained at 20° C. To the solution was added 10 parts by weight of 70% nitric acid, and was further added 16 parts by weight of butylaldehyde. Next, the solution was cooled down to 10° C., and then 45 parts by weight of butylaldehyde was added to the solution. After resin precipitation and the subsequent 30 minute standing, 60 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group (the amount of the structural unit represented by the formula (1)) was 30 mol %, the amount of a butyral unit (the amount of the structural unit represented by the formula (2)) was 67 mol %, the amount of an acetyl unit (the amount of the structural unit represented by the formula (3)) was 1 mol %, and the amount of a structural unit having $R^2$ represented by the formula (8) (the amount of the structural unit represented by the formula (4)) was 2 mol %.

Preparation of Resin Sheet

To 80 parts by weight of an ethanol/toluene mixed solvent (mixing ratio: 1/1) was added 20 parts by weight of the obtained modified polyvinyl acetal resin, and then stirred for 48 hours by a mixing rotor to be dissolved in the solvent.

The obtained solution was applied on a mold release-treated polyester film by an applicator such that the thickness of a dried material was to be 20 μm. The solution was air-dried at normal temperature for an hour to provide a modified polyvinyl acetal resin film.

The obtained modified polyvinyl acetal resin film was irradiated with ultraviolet light (exposure dose: 3000 mJ/cm², application time period: 30 seconds) having a wavelength of 365 nm by a metal halide lamp (produced by SEN LIGHTS Corp.) to provide a resin sheet.

Example 2

A resin sheet was prepared in the same manner as in Example 1 except for irradiating the obtained modified polyvinyl acetal resin film with ultraviolet light (exposure dose: 1000 mJ/cm², application time period: 30 seconds) having a wavelength of 365 nm by a metal halide lamp (produced by SEN LIGHTS Corp.) in the process of (Preparation of resin sheet) in Example 1.

Example 3

A modified polyvinyl acetal resin was prepared in the same manner as in Example 1 except for using a modified polyvinyl alcohol (100 parts by weight, degree of saponification: 99.2%, amount of structural unit having $R^2$ represented by the formula (8): 4 mol %) in the process of (Preparation of modified polyvinyl acetal resin) in Example 1. In the obtained polyvinyl acetal resin, the amount of a residual hydroxy group was 29 mol %, the amount of a butyral unit was 66 mol %, the amount of an acetyl unit was 1 mol %, and the amount of an $R^2$ unit represented by the formula (8) was 4 mol %.

Next, except for using the obtained modified polyvinyl acetal resin, a modified polyvinyl acetal resin film and a resin sheet were prepared in the same manner as in Example 1.

Example 4

Preparation of Modified Polyvinyl Acetal Resin

A modified polyvinyl acetal resin was prepared in the same manner as in Example 1 except for using a modified polyvinyl alcohol (100 parts by weight, degree of saponification: 99%, amount of structural unit having $R^2$ represented by the formula (9): 4 mol %) in the process of (Preparation of modified polyvinyl acetal resin) in Example 1.

In the obtained polyvinyl acetal resin, the amount of a residual hydroxy group was 28 mol %, the amount of a butyral unit was 67 mol %, the amount of an acetyl unit was 1 mol %, and the amount of a structural unit having $R^2$ represented by the formula (9) (the amount of the structural unit represented by the formula (4)) was 4 mol %.

Next, except for using the obtained modified polyvinyl acetal resin, a modified polyvinyl acetal resin film and a resin sheet were prepared in the same manner as in Example 1.

Example 5

Preparation of Modified Polyvinyl Acetal Resin

A modified polyvinyl alcohol (100 parts by weight, degree of saponification: 98.8%, amount of the structural unit having $R^2$ represented by the formula (8): 2 mol %) was dissolved in 1200 parts by weight of distilled water under heating, and then the solution was cooled down. To the solution was added 76 parts by weight of 70% nitric acid, and were further added 40 parts by weight of butylaldehyde and 15 parts by weight of acetaldehyde. After resin precipitation and the subsequent 30 minute standing, the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 28 mol %, the amount of a butyral unit was 38 mol %, the amount of an acetal unit ($R^1$: methyl group) was 31 mol %, the amount of an acetyl unit was 1 mol %, and the amount of a structural unit having $R^2$ represented by the formula (8) was 2 mol %.

Except for using the obtained modified polyvinyl acetal resin, a modified polyvinyl acetal resin film and a resin sheet were prepared in the same manner as in Example 1.

Example 6

A modified polyvinyl acetal resin film was prepared in the same manner as in Example 5 by using the modified polyvinyl acetal resin obtained in the process of (Preparation of modified polyvinyl acetal resin) in Example 5. Then, except for irradiating the obtained modified polyvinyl acetal resin film with ultraviolet light (exposure dose: 1000 mJ/cm$^2$, application time period: 30 seconds) having a wavelength of 365 nm by a metal halide lamp (produced by SEN LIGHTS Corp.), a modified polyvinyl acetal resin film and a resin sheet was prepared in the same manner as in Example 5.

Comparative Example 1

Preparation of Polyvinyl Acetal Resin

A polyvinyl alcohol (100 parts by weight, degree of saponification: 99.5%) was dissolved in 1200 parts by weight of distilled water under heating, and then the solution was maintained at 20° C. To the solution was added 10 parts by weight of 70% nitric acid, and was further added 16 parts by weight of butylaldehyde. Next, the solution was cooled down to 10° C., and then 45 parts by weight of butylaldehyde was added to the solution. After resin precipitation and the subsequent 30 minute standing, 60 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a polyvinyl acetal resin.

In the polyvinyl acetal resin obtained, the amount of a residual hydroxy group was 32 mol %, the amount of a butyral unit was 67 mol %, and the amount of an acetyl unit was 1 mol %.

Except for using the obtained polyvinyl acetal resin, a polyvinyl acetal resin film and a resin sheet were prepared in the same manner as in Example 1.

Comparative Example 2

A polyvinyl acetal resin film and a resin sheet were prepared in the same manner as in Example 2 except for using the polyvinyl acetal resin obtained in the process of (Preparation of polyvinyl acetal resin) in Comparative Example 1.

Comparative Example 3

A polyvinyl alcohol (100 parts by weight, degree of saponification: 99.5%) was dissolved in 1200 parts by weight of distilled water under heating, and then the solution was maintained at 20° C. To the solution was added 70 parts by weight of 70% nitric acid, and were further added 35 parts by weight of butylaldehyde and 20 parts by weight of acetaldehyde. After resin precipitation and the subsequent 30 minute standing, the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down. The solution was washed under running distilled water for 2 hours, and then dehydrated and dried to provide a polyvinyl acetal resin.

In the polyvinyl acetal resin obtained, the amount of a residual hydroxy group was 28 mol %, the amount of a butyral unit was 31 mol %, the amount of an acetal unit ($R^1$: methyl group) was 40 mol %, and the amount of an acetyl unit was 1 mol %.

Except for using the obtained polyvinyl acetal resin, a polyvinyl acetal resin film and a resin sheet were prepared in the same manner as in Example 1.

Comparative Example 4

A modified polyvinyl acetal resin was prepared in the same manner as in Example 1. To 80 parts by weight of an ethanol/toluene mixed solvent (mixing ratio: 1/1) was added 20 parts by weight of the obtained modified polyvinyl acetal resin, and then stirred for 48 hours by a mixing rotor to be dissolved in the solvent.

The obtained solution was applied on a mold release-treated polyester film by an applicator such that the thickness of a dried material was to be 20 μm. The solution was air-dried at normal temperature for an hour, and then dried in an oven at 80° C. for 30 minutes to provide a resin sheet.

Comparative Example 5

A modified polyvinyl acetal resin was prepared in the same manner as in Example 1. To 80 parts by weight of an ethanol/toluene mixed solvent (mixing ratio: 1/1) was added 20 parts by weight of the obtained modified polyvinyl acetal resin, and then stirred for 48 hours by a mixing rotor to be dissolved in the solvent. The obtained solution was applied on a mold release-treated polyester film by an applicator such that the thickness of a dried material was to be 20 μm. The solution was air-dried at normal temperature for an hour, and then dried in an oven at 100° C. for 6 hours to provide a resin sheet.

Evaluations (1) Solubility to Solvent

The resin sheet obtained in each of Examples 1 to 6 and Comparative Examples 1 to 5 was immersed in (A) an ethanol/toluene mixed solvent (mixing ratio: 1/1), (B) terpineol, and (C) butanol. At 5 minutes and at a day after the start of the immersion, the dissolution state of the resin sheet was visually observed. Table 1 shows the results.

(2) Degree of Cross-Linkage

In the case where the resin sheet was immersed in the solvent (A) in the evaluation (1) Solubility to solvent, the solution in which the resin sheet had been immersed for a day was filtered off by a mesh filter (45 mesh, opening size: about 560 μm). The degree of cross-linkage was measured by the following formula. Table 1 shows the results.

$$\text{Degree of cross-linkage}(\%) = (\text{weight of resin on mesh filter}/\text{weight of resin sheet before dissolution}) \times 100 \quad [\text{Math. 1}]$$

(3) Strength

The resin sheet obtained in each of Examples 1 to 6 and Comparative Examples 1 to 5 was released from the polyester film, and then stress at break and elastic modulus were measured by using a Tensilon tensile tester. The test sample was in a size of 20 mm in length×50 mm in width, and the test speed was 50 mm/minute. Table 1 shows the results.

(4) Patterning

The resin film obtained in each of the Examples 1 to 6 and Comparative Examples 1 and 2 was covered with an iron plate from which a letter was cut out. Then, ultraviolet light having a wavelength of 365 nm was applied to the plate-covered resin film from above by a metal halide lamp (produced by SEN LIGHTS Corp.) for 30 seconds to prepare a resin sheet. The exposure dose of ultraviolet light was set to 3000 mJ/cm$^2$ in Examples 1 and 3 to 5 and Comparative Example 1, and 1000 mJ/cm$^2$ in Examples 2 and 6 and Comparative Example 2.

The obtained resin sheet was washed by methanol. Then, the washed resin sheet was visually observed whether or not the shape of the letter was retained, and this was evaluated as follows. Table 1 shows the results.

○: Shape was retained; and
x: Shape was not retained.

TABLE 1

| | Solvility to solvent | | | | | | Degree of cross-linkage (%) | Strength | | |
|---|---|---|---|---|---|---|---|---|---|---|
| | Ethanol/toluene mixed solvent | | Terpineol | | Butanol | | | Stress at break (MPa) | Elastic modulus (MPa) | |
| | 5 minutes | 1 day | 5 minutes | 1 day | 5 minutes | 1 day | | | | Patterning |
| Example 1 | Not dissolved | Not dissolved | Not dissolved | Not dissolved | Not dissolved | Not dissolved | 99 | 80 | 2500 | ○ |
| Example 2 | Not dissolved | Not dissolved | Not dissolved | Not dissolved | Not dissolved | Not dissolved | 40 | 60 | 2100 | ○ |
| Example 3 | Not dissolved | Not dissolved | Not dissolved | Not dissolved | Not dissolved | Not dissolved | 99 | 80 | 2600 | ○ |
| Example 4 | Not dissolved | Not dissolved | Not dissolved | Not dissolved | Not dissolved | Not dissolved | 85 | 70 | 2000 | ○ |
| Example 5 | Not dissolved | Not dissolved | Not dissolved | Not dissolved | Not dissolved | Not dissolved | 99 | 85 | 2650 | ○ |
| Example 6 | Not dissolved | Not dissolved | Not dissolved | Not dissolved | Not dissolved | Not dissolved | 80 | 75 | 2500 | ○ |
| Comparative Example 1 | Dissolved | Dissolved | Not dissolved | Dissolved | Dissolved | Dissolved | 0 | 60 | 1700 | X |
| Comparative Example 2 | Dissolved | Dissolved | Not dissolved | Dissolved | Dissolved | Dissolved | 0 | 60 | 1700 | X |
| Comparative Example 3 | Dissolved | Dissolved | Not dissolved | Dissolved | Dissolved | Dissolved | 0 | 50 | 1850 | — |
| Comparative Example 4 | Dissolved | Dissolved | Not dissolved | Dissolved | Dissolved | Dissolved | 0 | 50 | 1850 | — |
| Comparative Example 5 | Partially not dissolved | Partially not dissolved | Partially not dissolved | Partially not dissolved | Partially not dissolved | Partially not dissolved | 5 | 50 | 1850 | — |

Example 7

Preparation of Modified Polyvinyl Acetal Resin

A modified polyvinyl alcohol (100 parts by weight, degree of saponification: 98.8%, amount of the structural unit having $R^2$ represented by the formula (8): 2 mol %) was dissolved in 1200 parts by weight of distilled water under heating, and then the solution was maintained at 20° C. To the solution was added 10 parts by weight of 70% nitric acid, and was further added 16 parts by weight of butylaldehyde. Next, the solution was cooled down to 10° C., and then 45 parts by weight of butylaldehyde was added to the solution. After resin precipitation and the subsequent 30 minute standing, 60 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 30 mol %, the amount of a butyral unit was 67 mol %, the amount of a structural unit having $R^2$ represented by the formula (8) was 2 mol %, and the amount of an acetyl unit was 1 mol %.

Preparation of Resin Composition

The obtained modified polyvinyl acetal resin (10 parts by weight), methyl ethyl ketone (40 parts by weight), and toluene (40 parts by weight) were mixed by a ball mill for 24 hours and the resin was dissolved in the solvents under stirring to provide a resin composition.

Formation of Thermal Transfer Protecting Layer

The obtained resin composition was applied on a polyester supporting medium by a coater such that the thickness of a dried resin composition was to be 5 μm. The resin composition was air-dried at normal temperature for an hour, and then irradiated with ultraviolet light (exposure dose: 3000 mJ/cm$^2$, application time period: 30 seconds) having a wavelength of 365 nm by a metal halide lamp (produced by SEN LIGHTS Corp.) to provide a thermal transfer sheet having a thermal transfer protecting layer.

Example 8

A modified polyvinyl acetal resin was prepared by using a modified polyvinyl alcohol (100 parts by weight, degree of saponification: 99.2%, amount of the structural unit having $R^2$ represented by the formula (8): 4 mol %) in the process of (Preparation of modified polyvinyl acetal resin) in Example 7.

A thermal transfer sheet having a thermal transfer protecting layer was prepared in the same manner as in Example 7 except for using the obtained modified polyvinyl acetal resin. In the obtained polyvinyl acetal resin, the amount of a residual hydroxy group was 29 mol %, the amount of a butyral unit was 66 mol %, the amount of a structural unit having $R^2$ represented by the formula (8) was 4 mol %, and the amount of an acetyl unit was 1 mol %.

Example 9

Preparation of Modified Polyvinyl Acetal Resin

A modified polyvinyl alcohol (100 parts by weight, degree of saponification: 99%, amount of the structural unit having $R^2$ represented by the formula (9): 4 mol %) was dissolved in 1200 parts by weight of distilled water under heating, and then the solution was maintained at 20° C. To the solution was added 10 parts by weight of 70% nitric acid, and was further added 16 parts by weight of butylaldehyde. Next, the solution was cooled down to 10° C., and then 45 parts by weight of butylaldehyde was added to the solution. After resin precipitation and the subsequent 30 minute standing, 60 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 28 mol %, the amount of a butyral unit was 67 mol %, the amount of a structural unit having $R^2$ represented by the formula (9) was 4 mol %, and the amount of an acetyl unit was 1 mold.

Except for using the obtained modified polyvinyl acetal resin, a thermal transfer sheet having a thermal transfer protecting layer was prepared in the same manner as in Example 7.

Example 10

Preparation of Modified Polyvinyl Acetal Resin

A modified polyvinyl alcohol (100 parts by weight, degree of saponification: 98.8%, amount of the structural unit having $R^2$ represented by the formula (8): 2 mol %) was dissolved in 1200 parts by weight of distilled water under heating, and then the solution was cooled down. To the solution was added 76 parts by weight of 70% nitric acid, and were further added 40 parts by weight of butylaldehyde and 15 parts by weight of acetaldehyde. After resin precipitation and the subsequent 30 minute standing, the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 28 mol %, the amount of a butyral unit was 38 mol %, the amount of an acetal unit ($R^1$: methyl group) was 31 mol %, the amount of an acetyl unit was 1 mol %, and the amount of a structural unit having $R^2$ represented by the formula (8) was 2 mol %.

Except for using the obtained modified polyvinyl acetal resin, a thermal transfer sheet having a thermal transfer protecting layer was prepared in the same manner as in Example 7.

Example 11

Formation of Thermal Transfer Sheet Having Thermal Transfer Ink Layer

To 50 parts by weight of the resin composition obtained in Example 7 was added 4 parts by weight of a yellow dye (ESCYellow155, produced by Sumitomo Chemical Co., Ltd.) and sufficiently stirred to provide a mixture. The mixture was applied on a mold release-treated polyester film by a coater such that the thickness of a dried resin was to be 5 μm. The mixture was air-dried at normal temperature for an hour, and then irradiated with ultraviolet light (exposure dose: 3000 mJ/cm$^2$, application time period: 30 seconds) having a wavelength of 365 nm by a metal halide lamp (produced by SEN LIGHTS Corp.) to provide a thermal transfer sheet having a thermal transfer ink layer.

Comparative Example 6

A thermal transfer sheet having a thermal transfer protecting layer was prepared in the same manner as in Example 7 except for using a polyvinyl acetal resin in which the amount of a residual hydroxy group was 32 mol %, the amount of a butyral unit was 67 mol %, and the amount of an acetyl unit was 1 mol % instead of using the modified polyvinyl acetal resin in the process of (Preparation of resin composition) in Example 7.

Comparative Example 7

A thermal transfer sheet having a thermal transfer protecting layer was prepared in the same manner as in Example 7 except for using a polyvinyl acetal resin in which the amount of a residual hydroxy group was 28 mol %, the amount of a butyral unit was 31 mol %, the amount of an acetal unit ($R^1$: methyl group) was 40 mol %, and the amount of an acetyl unit was 1 mol % instead of using the modified polyvinyl acetal resin in the process of (Preparation of resin composition) in Example 7.

Comparative Example 8

A modified polyvinyl acetal resin and a resin composition were prepared in the same manner as in Example 7. The obtained resin composition was applied on a mold release-treated polyester film by a coater such that the thickness of a dried resin was to be 5 μm. The resin composition was air-dried at normal temperature for an hour, and then dried in an oven at 80° C. for 30 minutes to provide a thermal transfer sheet having a thermal transfer protecting layer.

Comparative Example 9

A modified polyvinyl acetal resin and a resin composition were prepared in the same manner as in Example 7. The obtained resin composition was applied on a mold release-treated polyester film by a coater such that the thickness of a dried resin was to be 5 μm. The resin composition was air-dried at normal temperature for an hour, and then dried in an oven at 100° C. for 6 hours to provide a thermal transfer sheet having a thermal transfer protecting layer.

Comparative Example 10

A thermal transfer sheet having a thermal transfer ink layer was prepared in the same manner as in Example 11 except for using a polyvinyl acetal resin in which the amount of a residual hydroxy group was 32 mol %, the amount of a butyral unit was 67 mol %, and the amount of an acetyl unit was 1 mol % instead of using the modified polyvinyl acetal resin in the process of (Preparation of thermal transfer sheet having thermal transfer ink layer) in Example 11.

Evaluations (1) Measurement of Stress at Break and Elastic Modulus

The polyester supporting medium was released from the thermal transfer sheet obtained in each of the examples and the comparative examples to provide a film. Then, stress at break and elastic modulus of the film were measured by using a Tensilon tensile tester. The test sample was in a size of 20 mm in length×50 mm in width, and the test speed was 50 mm/minute.

(2) Friction Resistance

The surfaces of the thermal transfer ink layer and the thermal transfer protecting layer of the obtained thermal transfer sheet were rubbed by a pad. Presence of a scratch on the surfaces was observed, and evaluated as follows.
 ○: No scratch was observed;
 x: A few scratches were observed; and
 xx: Scratches were observed.

TABLE 2

|  | Stress at break (MPa) | Elastic modulus (MPa) | Friction resistance |
|---|---|---|---|
| Example 7 | 80 | 2500 | ○ |
| Example 8 | 80 | 2600 | ○ |
| Example 9 | 70 | 2000 | ○ |
| Example 10 | 85 | 2650 | ○ |
| Example 11 | 70 | 2200 | ○ |
| Comparative Example 6 | 60 | 1700 | X |
| Comparative Example 7 | 50 | 1850 | X |
| Comparative Example 8 | 50 | 1850 | X |
| Comparative Example 9 | 50 | 1850 | X |
| Comparative Example 10 | 55 | 1600 | X |

Example 12

Preparation of Modified Polyvinyl Acetal Resin

A modified polyvinyl alcohol (100 parts by weight, degree of saponification: 98.8%, amount of the structural unit having $R^2$ represented by the formula (8): 2 mol %) was dissolved in 1200 parts by weight of distilled water under heating, and then the solution was maintained at 20° C. To the solution was added 10 parts by weight of 70% nitric acid, and was further added 16 parts by weight of butylaldehyde. Next, the solution was cooled down to 10° C., and then 45 parts by weight of butylaldehyde was added to the solution. After resin precipitation and the subsequent 30 minute standing, 60 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group (the amount of the structural unit represented by the formula (1)) was 30 mol %, the amount of a butyral unit was 67 mol %, the amount of a structural unit having $R^2$ represented by the formula (8) was 2 mol %, and the amount of an acetyl unit was 1 mol %.

Preparation of Resin Composition for Offset Printing Plate

The obtained polyvinyl acetal resin (15 parts by weight) and a solvent (ethanol, 85 parts by weight) were mixed under stirring to provide a resin composition for an offset printing plate.

Preparation of Molded Body for Offset Printing Plate

The obtained resin composition for an offset printing plate was applied on an aluminum plate with a wire bar, and then left still in a drier at 90° C. for 5 minutes for drying. The dried resin composition was covered with an iron plate from which a letter was cut out. Then, ultraviolet light (exposure dose: 3000 mJ/cm$^2$, application time period: 30 seconds) having a wavelength in the range of 200 to 365 nm was applied to the plate-covered resin composition by a metal halide lamp (produced by SEN LIGHTS Corp.) to provide a molded body for an offset printing plate.

Example 13

Preparation of Modified Polyvinyl Acetal Resin

A modified polyvinyl alcohol (100 parts by weight, degree of saponification: 98.8%, amount of the structural unit having $R^2$ represented by the formula (9): 2 mol %) was dissolved in 1200 parts by weight of distilled water under heating, and then the solution was cooled down. To the solution was added 76 parts by weight of 70% nitric acid, and were further added 40 parts by weight of butylaldehyde and 15 parts by weight of acetaldehyde. After resin precipitation and the subsequent 30 minute standing, the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 28 mol %, the amount of an acetal unit ($R^1$: methyl group) was 38 mol %, the amount of a butyral unit was 31 mol %, the amount of a structural unit having $R^2$ represented by the formula (9) was 2 mol %, and the amount of an acetyl unit was 1 mol %.

Preparation of Resin Composition and Molded Body for Offset Printing Plate

Except for using the obtained modified polyvinyl acetal resin, a resin composition for an offset printing plate and a molded body for an offset printing plate were prepared in the same manner as in Example 12.

Example 14

Preparation of Modified Polyvinyl Acetal Resin

A modified polyvinyl alcohol (100 parts by weight, degree of saponification: 98.8%, amount of the structural unit having $R^2$ represented by the formula (8): 4 mol %) was dissolved in 1200 parts by weight of distilled water under heating, and then the solution was cooled down. To the solution was added 75 parts by weight of 70% nitric acid, and were further added 20 parts by weight of butylaldehyde and 36 parts by weight of acetaldehyde. After resin precipitation and the subsequent 30 minute standing, the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 27 mol %, the amount of an acetal unit ($R^1$: methyl group) was 58 mol %, the amount of a butyral unit was 10 mol %, the amount of an acetyl unit was 1 mol %, and the amount of a structural unit having $R^2$ represented by the formula (8) was 4 mol %.

Preparation of Resin Composition and Molded Body for Offset Printing Plate

Except for using the obtained modified polyvinyl acetal resin, a resin composition for an offset printing plate and a molded body for an offset printing plate were prepared in the same manner as in Example 12.

Example 15

Preparation of Modified Polyvinyl Acetal Resin

A modified polyvinyl alcohol (100 parts by weight, degree of saponification: 98.8%, amount of the structural unit having $R^2$ represented by the formula (8): 3 mol %) was dissolved in 1200 parts by weight of distilled water under heating, and then the solution was cooled down. To the solution was added 40 parts by weight of 70% nitric acid, and was further added 60 parts by weight of acetaldehyde. After resin precipitation and the subsequent 30 minute standing, 70 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 26 mol %, the amount of an acetal unit ($R^1$: methyl group) was 70 mol %, the amount of an acetyl unit was 1 mol %, and the amount of a structural unit having $R^2$ represented by the formula (8) was 3 mold.

Preparation of Resin Composition and Molded Body for Offset Printing Plate

Except for using the obtained modified polyvinyl acetal resin, a resin composition for an offset printing plate and a molded body for an offset printing plate were prepared in the same manner as in Example 12.

Example 16

Preparation of Modified Polyvinyl Acetal Resin

A modified polyvinyl alcohol (100 parts by weight, degree of saponification: 99.5%, amount of the structural unit having $R^2$ represented by the formula (9): 5 mol %) was dissolved in 1200 parts by weight of distilled water under heating, and then the solution was cooled down. To the solution was added 40 parts by weight of 70% nitric acid, and was further added 60 parts by weight of acetaldehyde. After resin precipitation and the subsequent 30 minute standing, 70 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a modified polyvinyl acetal resin. In the modified polyvinyl acetal resin obtained, the amount of a residual hydroxy group was 25 mol %, the amount of an acetal unit ($R^1$: methyl group) was 69 mol %, the amount of an acetyl unit was 1 mol %, and the amount of a structural unit having $R^2$ represented by the formula (9) was 5 mol %.

Preparation of Resin Composition and Molded Body for Offset Printing Plate

Except for using the obtained modified polyvinyl acetal resin, a resin composition for an offset printing plate and a molded body for an offset printing plate were prepared in the same manner as in Example 12.

Example 17

Preparation of Modified Polyvinyl Acetal Resin

A modified polyvinyl alcohol (100 parts by weight, degree of saponification: 99.2%, amount of the structural unit having $R^2$ represented by the formula (9): 2 mol %, the amount of a carboxyl group: 2 mol %) was dissolved in 1200 parts by weight of distilled water under heating, and then the solution was cooled down. To the solution was added 40 parts by weight of 70% nitric acid, and was further added 60 parts by weight of acetaldehyde. After resin precipitation and the subsequent 30 minute standing, 70 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down. Next, the solution was washed under running distilled water for 2 hours, and then dehydrated and dried to provide a modified polyvinyl acetal resin.

In the modified polyvinyl acetal resin obtained, the amount of a carboxylic acid-modified group was 2 mol %, the amount of a residual hydroxy group was 25 mol %, the amount of an acetal unit ($R^1$: methyl group) was 70 mol %, the amount of an acetyl unit was 1 mol %, and the amount of a structural unit having $R^2$ represented by the formula (9) was 2 mol %.

Preparation of Resin Composition and Molded Body for Offset Printing Plate

Except for using the obtained modified polyvinyl acetal resin, a resin composition for an offset printing plate and a molded body for an offset printing plate were prepared in the same manner as in Example 12.

Example 18

Preparation of Resin Composition and Molded Body for Offset Printing Plate

The resin composition for an offset printing plate obtained in Example 17 was applied on an aluminum plate with a wire bar, and then dried by a drier at 90° C. for 5 minutes. The dried resin composition was covered with an iron plate from which a letter was cut out. Then, ultraviolet light (exposure dose: 3000 mJ/cm$^2$, application time period: 30 seconds) having a wavelength in the range of 230 to 400 nm was applied to the plate-covered resin composition by a metal halide lamp (produced by SEN LIGHTS Corp.) to provide a molded body for an offset printing plate.

Comparative Example 11

Preparation of Polyvinyl Acetal Resin

A polyvinyl alcohol (100 parts by weight, degree of saponification: 99.5%) was dissolved in 1200 parts by weight of distilled water under heating, and then the solution was maintained at 20° C. To the solution was added 10 parts by weight of 70% nitric acid, and was further added 16 parts by weight of butylaldehyde. Next, the solution was cooled down to 10° C., and then 45 parts by weight of butylaldehyde was added to the solution. After resin precipitation and the subsequent 30 minute standing, 60 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down.

Next, the solution was washed under running distilled water for 2 hours, and then dehydrated and dried to provide a polyvinyl acetal resin.

In the polyvinyl acetal resin obtained, the amount of a residual hydroxy group was 32 mol %, the amount of a butyral unit was 67 mol %, and the amount of an acetyl unit was 1 mol %.

Preparation of Resin Composition and Molded Body for Offset Printing Plate

Except for using the obtained polyvinyl acetal resin, a resin composition for an offset printing plate and a molded body for an offset printing plate were prepared in the same manner as in Example 12.

Comparative Example 12

Preparation of Polyvinyl Acetal Resin

A polyvinyl alcohol (100 parts by weight, degree of saponification: 99.5%) was dissolved in 1200 parts by weight of distilled water under heating, and then the solution was maintained at 20° C. To the solution was added 70 parts by weight of 70% nitric acid, and were further added 35 parts by weight of butylaldehyde and 20 parts by weight of acetaldehyde. After resin precipitation and the subsequent 30 minute standing, the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down. The solution was washed under running distilled water for 2 hours, and then dehydrated and dried to provide a polyvinyl acetal resin.

In the polyvinyl acetal resin obtained, the amount of a residual hydroxy group was 28 mol %, the amount of an acetal unit ($R^1$: methyl group) was 40 mol %, the amount of a butyral unit was 31 mol %, and the amount of an acetyl unit was 1 mol %.

Preparation of Resin Composition and Molded Body for Offset Printing Plate

Except for using the obtained polyvinyl acetal resin, a resin composition for an offset printing plate and a molded body for an offset printing plate were prepared in the same manner as in Example 12.

Comparative Example 13

Preparation of Polyvinyl Acetal Resin

A polyvinyl alcohol (100 parts by weight, degree of saponification: 99.5%) was dissolved in 1200 parts by weight of distilled water under heating, and then the solution was maintained at 20° C. To the solution was added 75 parts by weight of 70% nitric acid, and were further added 25 parts by weight of butylaldehyde and 35 parts by weight of acetaldehyde. After resin precipitation and the subsequent 30 minute standing, the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down. The solution was washed under running distilled water for 2 hours, and then dehydrated and dried to provide a polyvinyl acetal resin.

In the polyvinyl acetal resin obtained, the amount of a residual hydroxy group was 29 mol %, the amount of an acetal unit ($R^1$: methyl group) was 46 mol %, the amount of a butyral unit was 24 mol %, and the amount of an acetyl unit was 1 mol %.

Preparation of Resin Composition and Molded Body for Offset Printing Plate

Except for using the obtained polyvinyl acetal resin, a resin composition for an offset printing plate and a molded body for an offset printing plate were prepared in the same manner as in Example 12.

Comparative Example 14

Preparation of Polyvinyl Acetal Resin

A polyvinyl alcohol (100 parts by weight, degree of saponification: 99.5%) was dissolved in 1200 parts by weight of distilled water under heating, and then the solution was maintained at 20° C. To the solution was added 40 parts by weight of 70% nitric acid, and was further added 60 parts by weight of acetaldehyde. After resin precipitation and the subsequent 30 minute standing, 70 parts by weight of nitric acid was added to the solution, and then the solution was heated up to 35° C. and was maintained for 3 hours. After the reaction had finished, washing was performed under running distilled water for 10 hours. Thereafter, sodium hydroxide was added to the solution to adjust the pH of the solution to 8. The solution was allowed to stand at 50° C. for 6 hours, and then cooled down. The solution was washed under running distilled water for 2 hours, and then dehydrated and dried to provide a polyvinyl acetal resin.

In the polyvinyl acetal resin obtained, the amount of a residual hydroxy group was 27 mol %, the amount of an acetal unit ($R^1$: methyl group) was 72 mol %, and the amount of an acetyl unit was 1 mol %.

Preparation of Resin Composition and Molded Body for Offset Printing Plate

Except for using the obtained polyvinyl acetal resin, a resin composition for an offset printing plate and a molded body for an offset printing plate were prepared in the same manner as in Example 12.

Comparative Example 15

Preparation of Polyvinyl Acetal Resin

The resin composition for an offset printing plate obtained in Example 17 was applied on an aluminum plate with a wire bar, and then dried by a drier at 90° C. for 5 minutes. The dried resin composition was covered with an iron plate from which a letter was cut out. Then, light (exposure dose: 2000 mJ/cm$^2$, application time period: 30 seconds) having a wavelength in the range of 400 to 600 nm was applied to the plate-covered resin composition to provide a molded body for an offset printing plate.

Evaluations (1) Evaluation of Alkali-Washability (Washability and Patterning)

The obtained molded body for an offset printing plate was washed with a cooled aqueous solution of 0.1% sodium carbonate. The offset printing plate obtained after the washing was observed by an optical microscope, and was evaluated as follows.

Washability

∘: The molded body was perfectly cleaned;

Δ: The molded body was cleaned, but not perfectly; and x: A protruding portion and a recessed portion were indistinct on the offset printing plate.

Patterning

○: The shape was retained; and
x: The shape was not retained.

(2) Evaluation of Offset Printing Performance

Printing was performed by using the obtained offset printing plate. The obtained image-printed portion was visually observed and evaluated as follows:
○: Contrast was clear between the image-printed portion and the other portion;
Δ: Contrast was not clear between the image-printed portion and the other portion; and
x: Printing was impossible.

TABLE 3

|  | Ratio of methyl group:butyl group in acetal group (mol % to the whole amount) | Alkali-washability | | Offset printing performance |
|---|---|---|---|---|
|  |  | Patterning | Washability |  |
| Example 12 | 0:10 (0 mol %:67 mol %) | ○ | X | Δ |
| Example 13 | 5.5:4.5 (38 mol %:31 mol %) | ○ | Δ | ○ |
| Example 14 | 8.5:1.5 (58 mol %:10 mol %) | ○ | ○ | ○ |
| Example 15 | 10:0 (70 mol %:0 mol %) | ○ | ○ | ○ |
| Example 16 | 10:0 (69 mol %:0 mol %) | ○ | ○ | ○ |
| Example 17 | 10:0 (70 mol %:0 mol %) | ○ | ○ | ○ |
| Example 18 | 10:0 (70 mol %:0 mol %) | ○ | ○ | ○ |
| Comparative Example 11 | 0:10 (0 mol %:67 mol %) | X | X | X |
| Comparative Example 12 | 5.5:4.5 (40 mol %:31 mol %) | X | Δ | X |
| Comparative Example 13 | 6.6:3.4 (46 mol %:24 mol %) | X | ○ | X |
| Comparative Example 14 | 10:0 (72 mol %:0 mol %) | X | ○ | X |
| Comparative Example 15 | 10:0 (70 mol %:0 mol %) | X | ○ | X |

INDUSTRIAL APPLICABILITY

According to the present invention, it is possible to provide a method for producing a cross-linked polyvinyl acetal resin, which can provide a cross-linked polyvinyl acetal resin having high mechanical strength and excellent solvent resistance by a simple method without a cross-linking agent, and thus can solve such problems as sheet attack, insufficient strength, and instability of viscosity for a long time, and to provide a cross-linked polyvinyl acetal resin produced by the above method for producing a cross-linked polyvinyl acetal resin.

It is also possible to provide a method for producing a thermal transfer ink sheet which can provide a cross-linked polyvinyl acetal resin having high mechanical strength by a simple method without a cross-linking agent, and thus can solve such problems as insufficient strength and heat resistance of a thermal transfer ink sheet.

It is also possible to provide a method for producing an offset printing plate and a method for producing a negative resist, which can provide a cross-linked polyvinyl acetal resin having excellent photosensitivity and alkali-washability by a simple method without a cross-linking agent, and thus can solve such problems as unnecessary residues and undesired dissolution upon exposure-developing steps, and to provide a resin composition for a negative resist.

The invention claimed is:

1. A method for producing a cross-linked polyvinyl acetal resin, comprising the step of
   irradiating a polyvinyl acetal resin at least having structural units represented by the following formulas (1) to (4) with ultraviolet light having a wavelength in a range of 200 to 365 nm,

-continued

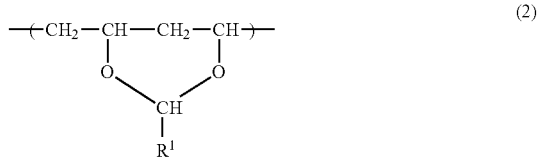

wherein $R^1$ represents a hydrogen atom or a C1-C20 hydrocarbon group; and $R^2$ is a group represented by the following formula (9)

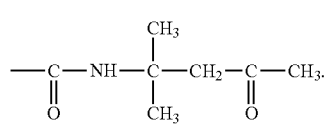 (9)
2. The method for producing a cross-linked polyvinyl acetal resin according to claim 1, wherein $R^1$ is a methyl group or a butyl group.
* * * * *